(12) United States Patent
Joshi et al.

(10) Patent No.: US 7,934,540 B2
(45) Date of Patent: May 3, 2011

(54) INTEGRATED LIQUID COOLING UNIT FOR COMPUTERS

(75) Inventors: Shrikant Mukund Joshi, Williamsville, NY (US); Mohinder Singh Bhatti, Amherst, NY (US); Ilya Reyzin, Williamsville, NY (US)

(73) Assignee: Delphi Technologies, Inc., Troy, MI (US)

( * ) Notice: Subject to any disclaimer, the term of this patent is extended or adjusted under 35 U.S.C. 154(b) by 1097 days.

(21) Appl. No.: 11/701,213

(22) Filed: Feb. 1, 2007

(65) Prior Publication Data

US 2008/0185129 A1 Aug. 7, 2008

(51) Int. Cl.
*H05K 7/20* (2006.01)
(52) U.S. Cl. .................. 165/80.4; 165/104.33; 361/699
(58) Field of Classification Search .................. 165/80.4, 165/104.33; 361/699
See application file for complete search history.

(56) References Cited

U.S. PATENT DOCUMENTS

| | | | | |
|---|---|---|---|---|
| 6,702,002 B2 * | 3/2004 | Wang | | 165/80.3 |
| 6,894,899 B2 * | 5/2005 | Wu et al. | | 361/699 |
| 7,100,677 B2 * | 9/2006 | Lee et al. | | 165/80.4 |
| 7,142,424 B2 * | 11/2006 | Malone et al. | | 361/697 |
| 7,466,550 B2 * | 12/2008 | Yeh et al. | | 361/700 |
| 7,548,425 B2 * | 6/2009 | Hata et al. | | 361/699 |
| 7,604,040 B2 * | 10/2009 | Ghosh et al. | | 165/80.3 |
| 2005/0103475 A1 * | 5/2005 | Lee et al. | | 165/104.33 |
| 2007/0023167 A1 * | 2/2007 | Liu et al. | | 165/80.4 |

* cited by examiner

*Primary Examiner* — Allen J Flanigan
(74) *Attorney, Agent, or Firm* — Arent Fox LLP

(57) ABSTRACT

An integrated liquid cooling unit comprising a liquid pump and a U-shaped flat tube. An adapter rigidly connects and establishes fluid communication between the pump and the tube creating an integrated unit for cooling an electronic chip via a closed loop. Heat is rejected from the coolant through cooling fins disposed between the legs of the U-shaped tube to passing air being propelled by a blower assembly.

28 Claims, 3 Drawing Sheets

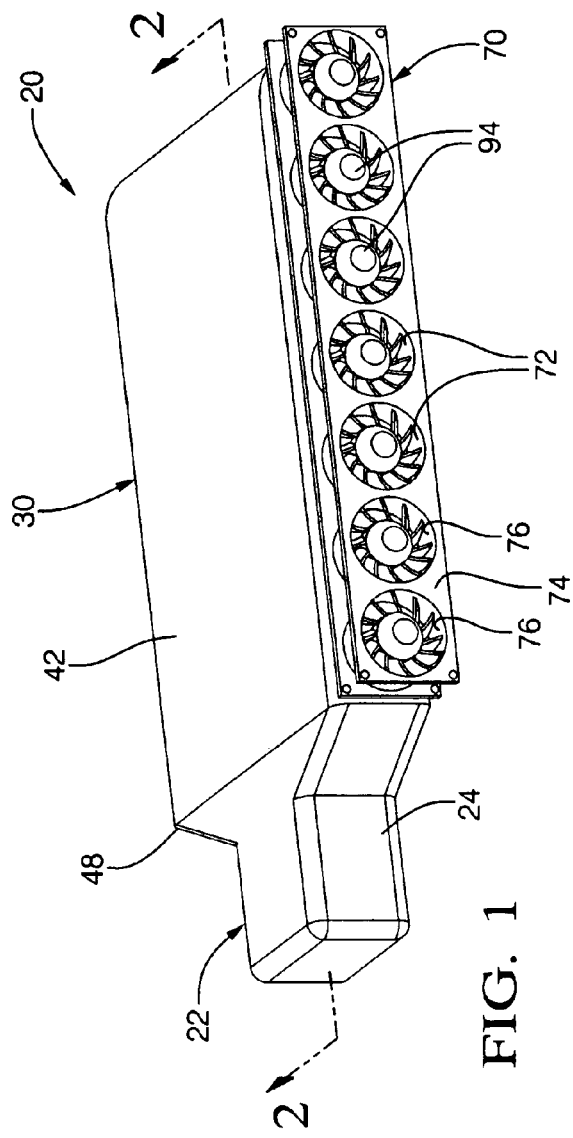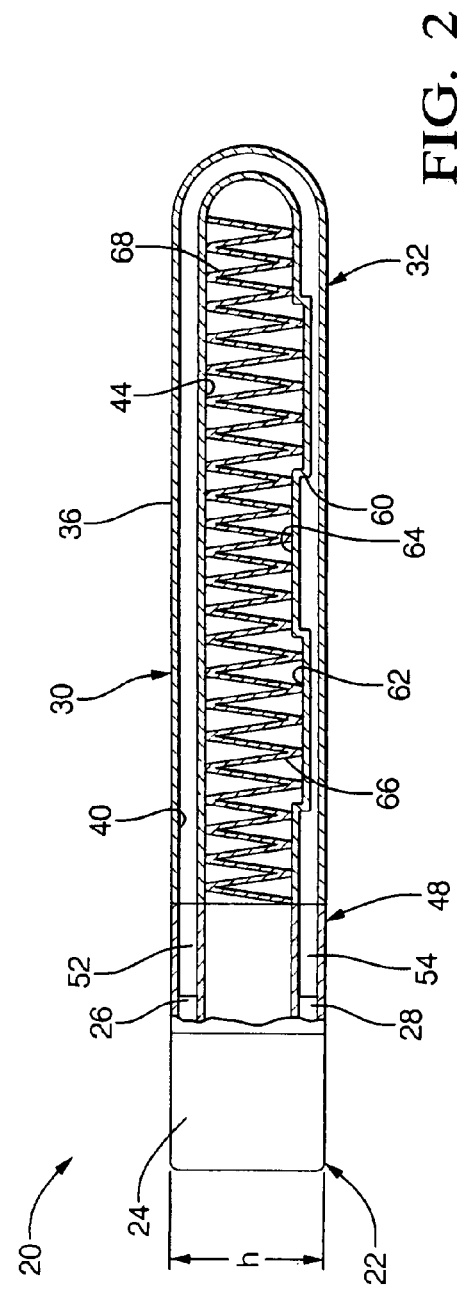

INTEGRATED LIQUID COOLING UNIT FOR COMPUTERS

FIELD OF INVENTION

An integrated liquid cooling unit for cooling a heat-producing electronic device.

BACKGROUND OF THE INVENTION

The operating speed of computers is constantly being improved to create faster and faster computers. With this comes increased heat generation and a need to effectively dissipate that heat.

Heat exchangers and heat sink assemblies have been used that apply natural or forced convection cooling methods to dissipate heat from electronic devices that are highly concentrated heat sources such as microprocessors and computer chips. These heat exchangers typically use air to directly remove heat from the electronic devices; however air has a relatively low heat capacity. Thus, many heat exchangers used to remove heat from electronic applications are liquid-cooled units, which employ a cold plate in conjunction with high heat capacity fluids.

One such heat exchanger is illustrated in U.S. Pat. No. 6,166,907 to Chien wherein a liquid pump cycles a liquid coolant through a tube to a first radiator mounted atop an electronic device. Heat is then transferred from the electronic device to the liquid coolant. The heated liquid coolant is directed via a pipe to a second radiator including a flat tube extending in serpentine fashion. Cooling fins of varying heights are disposed between the spaced and parallel legs of each of the U-shapes. A fan blows air between the legs of the second radiator and through the cooling fins.

U.S. Pat. No. 6,867,973 illustrates a heat exchanger which includes a passage mounted atop an electronic device producing heat. The passage includes a plurality of recessed and raised portions for increasing turbulence in the liquid coolant and increasing the rate at which heat is transferred from the electronic device to the liquid coolant.

SUMMARY OF THE INVENTION AND ADVANTAGES

The invention provides for an integrated liquid cooling unit assembly including an adapter that is an integral component rigidly connecting the liquid pump to the tube to prevent relative movement between the liquid pump and the tube. The adapter includes an input manifold establishing fluid communication between the outlet of the liquid pump and the heat exchange leg of the tube and an output manifold establishing fluid communication between the inlet of the liquid pump and the return leg of the tube.

Accordingly, the subject invention provides a unitary or integrated liquid cooling unit which can be mounted as a single unit to a heat-producing electronic device for removing heat.

BRIEF DESCRIPTION OF THE DRAWINGS

Other advantages of the present invention will be readily appreciated, as the same becomes better understood by reference to the following detailed description when considered in connection with the accompanying drawings wherein:

FIG. 1 is a perspective view of a first embodiment of the subject invention.

FIG. 2 is a cross sectional view taken along the line 2-2 of FIG. 1.

DETAILED DESCRIPTION OF THE INVENTION

Figure 3:
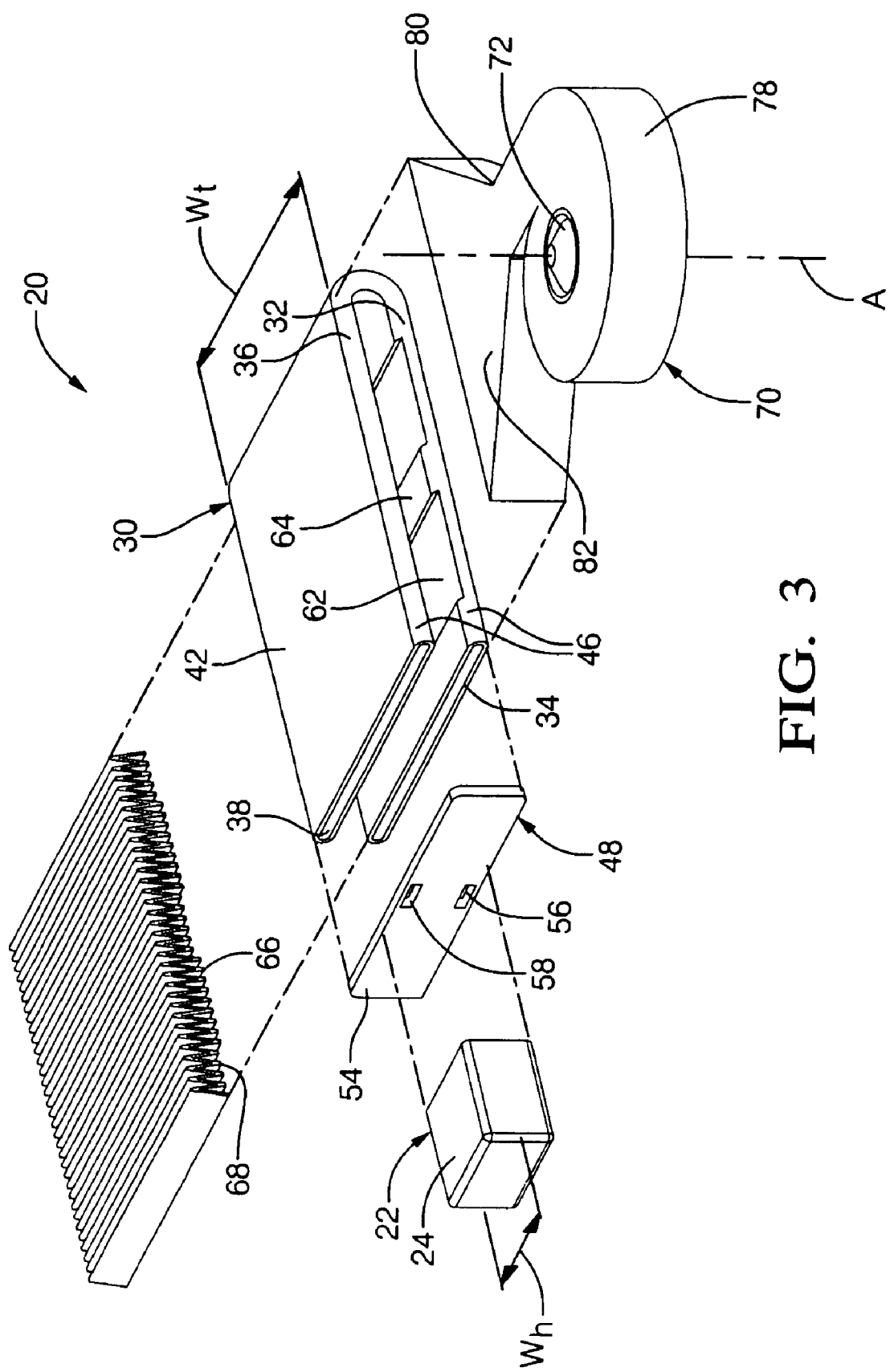
FIG. 3 is an exploded and perspective view of a second embodiment of the subject invention.

Referring to the Figures, wherein like numerals indicate corresponding parts throughout the several views, an integrated liquid cooling unit 20 for cooling an electronic device constructed in accordance with the subject invention is generally shown in FIG. 1.

A liquid pump 22, generally indicated, includes a housing 24 having a housing width $w_h$ and a housing height h and an inlet 26 and an outlet 28. The liquid pump 22 is preferably either an electrokinetic or a thermokinetic pump but any suitable pump may be employed. The pump housing 24 is typically made of plastic but any suitable material may be used. An accumulator, or a coolant volume compensator, may be disposed in the liquid pump 22 to regulate an increase in pressure in the coolant caused by thermal expansion. A coolant charge port may also be disposed in the liquid pump 22.

A flat tube 30, generally indicated, extends in a U-shape through a heat exchange leg 32 defining an entrance 34 and a return leg 36 defining an exit 38. The flat tube 30 has a cross-section presenting an interior surface 40. Each leg of the folded flat tube 30 presents an outside wall 42 and an inside wall 44 interconnected by rounded sides 46 defining a tube width $w_t$. The distance between the outside walls 42 of the flat tube 30 is no less than the housing height h of the liquid pump 22 and the tube width $w_t$ is no less than the housing width $w_h$ of the liquid pump 22. The tube 30 has a wall thickness preferably in the range of 2-3 mm but a thickness outside of this range may also be employed depending on the pressure exerted by the working fluid. The tube 30 is preferably made of aluminum but any suitable material may be employed.

An adapter 48, generally indicated, is an integral component rigidly connecting the liquid pump 22 to the flat tube 30, as by brazing. The adapter 48 includes an input manifold 50 establishing fluid communication between the outlet 28 of the liquid pump 22 and the entrance 34 of the flat tube 30 and the adapter 48 includes an output manifold 52 establishing fluid communication between the inlet 26 of the liquid pump 22 and the exit 38 of the flat tube 30.

In one embodiment as shown in FIGS. 1 and 2, the adapter 48 is fan-shaped and has a rectangular cross-sectional area increasing in size from the liquid pump 22 to the flat tube 30. The input manifold 50 of the adapter 48 diverges in a fan-shape from the outlet 28 of the liquid pump 22 to the entrance 34 of the flat tube 30 and the output manifold 52 extends parallel to the input manifold 50 and diverges in a fan-shape from the inlet 26 of the liquid pump 22 to the exit 38 of the flat tube 30.

In another embodiment as shown in FIG. 3, the adapter 48 is a plate 54 perpendicular to and covering the entrance 34 and the exit 38 of the flat tube 30. The input manifold 50 of the plate 54 includes a first port 56 extending from the outlet 28 of the liquid pump 22 to the entrance 34 of the flat tube 30. The output manifold 52 of the plate 54 includes a second port 58 extending parallel to the first port 56 from the inlet 26 of the liquid pump 22 to the exit 38 of the flat tube 30. The first and second ports 56, 58 have the same opening area as the inlet 26 and the outlet 28 of the liquid pumps 22 and extend across the adapter 48 to the wider entrance 34 and exit 38 of the flat tube 30.

A plurality of flow interrupters, defined by ribs 60, is disposed on the inside wall 44 of the heat exchange leg 32 of the flat tube 30. The ribs 60 extend across the interior surface 40 of the flat tube 30 for creating turbulence in the flow of the coolant to increase the rate at which heat is transferred from the flat tube 30 to the coolant. The ribs 60 define a reduced cross-sectional area along a section of the inside wall 44 of the heat exchange leg 32 and a rectangular recess 62 extending across the inside wall 44 of the heat exchange leg 32 between the rounded sides 46 thereof and define an un-recessed section 64 of the heat exchange leg 32.

A plurality of long cooling fins 66 extend along and into the rectangular recess 62 of said flat tube 30 and between the legs 32, 36 of the flat tube 30. A plurality of short cooling fins 68 extend along the un-recessed section 64 of the heat exchange leg 32 and between the legs 32, 36 of the flat tube 30. The fins 66, 68 preferably have a height in the range of 8-9 mm but a height outside of this range may also be employed depending on the pump housing height h, which is about 25 mm.

A blower assembly 70, generally indicated, is attached to and extends between the rounded sides 46 on one side 46 of the flat tube 30. The blower assembly 70 includes at least one fan 72 for blowing air over the cooling fins 66, 68 between the legs 32, 36 of the flat tube 30.

In the embodiment shown in FIG. 1, the blower assembly 70 includes a first cover 74 extending axially along and between the legs 32, 36 of the flat tube 30. The first cover 74 of the blower assembly 70 defines a plurality of holes 76. A fan 72 is disposed in each of the holes 76 for propelling air between the heat exchange and the return legs 32, 36 of the flat tube 30 and through the cooling fins 66, 68.

In the embodiment shown in FIG. 3, the blower assembly 70 includes a fan housing 78 having a spiral periphery extending about a first fan axis A to an exhaust 80. A fan 72 is supported for rotation about the first fan axis A. A hood 82 extends between the exhaust 80 of, the fan housing 78 and the legs 32, 36 of the flat tube 30 for directing air from the exhaust 80 to the space between the legs 32, 36 of the flat tube 30 and through the cooling fins 66, 68. The hood 82 has a rectangular cross-sectional area that increases in size from the exhaust 80 of the fan housing 78 to the rounded sides 46 of the legs 32, 36 of the flat tube 30. The invention may also include a cross-flow blower assembly 70 having a blower motor 84 at one end and an air intake at the other end.

Figure 4:
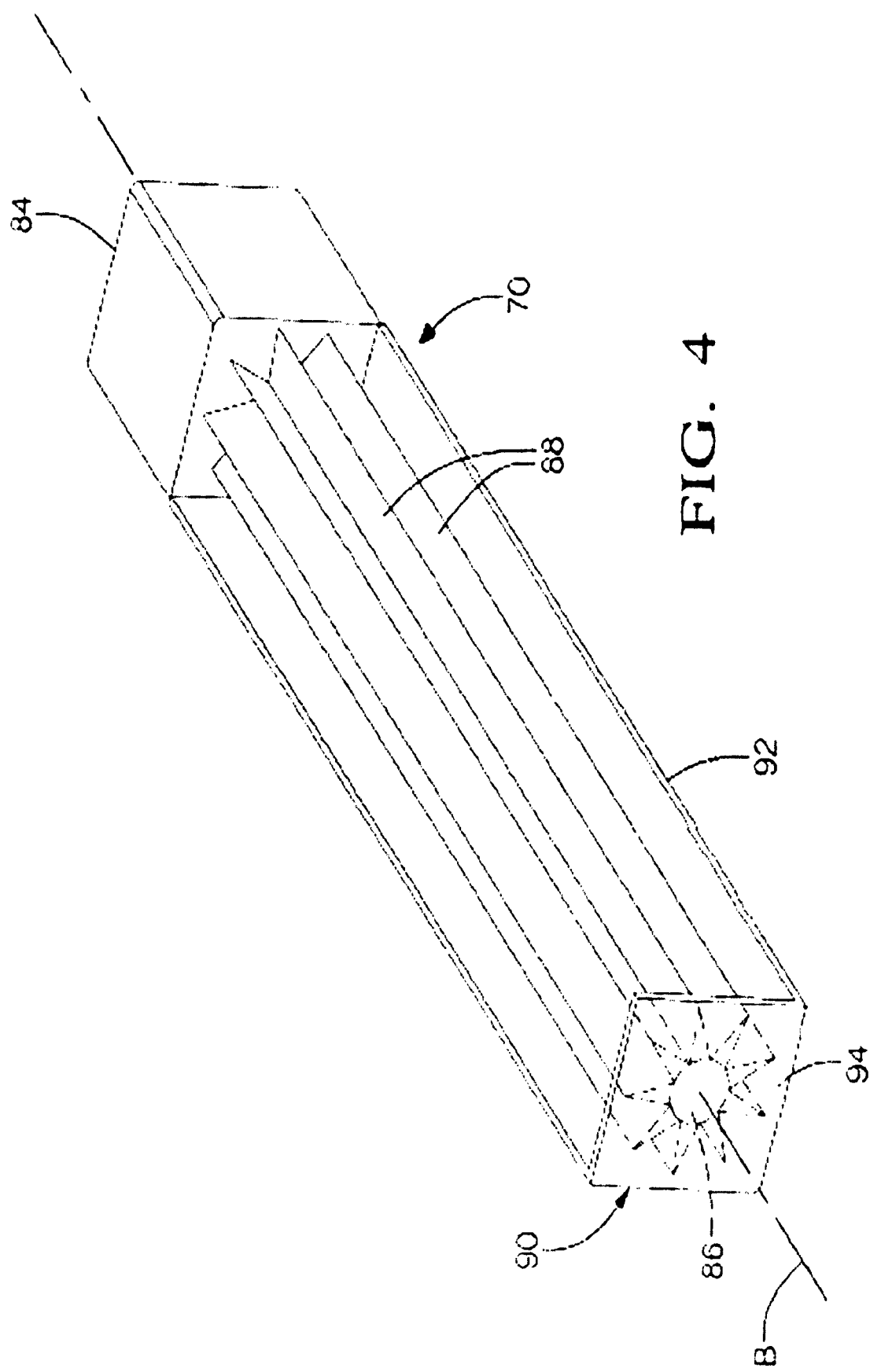
FIG. 4 is a perspective view of an alternate embodiment of the blower assembly.

In the embodiment shown in FIG. 4, the blower assembly 70 includes a second fan axis B extending parallel to the heat exchange and return legs 32, 36 of the flat tube 30 and disposed on one side 46 of the flat tube 30. A blower motor 84 is disposed along the second fan axis B and a hub 86 is operatively connected to the blower motor 84. The hub 86 extends along the second fan axis B from the blower motor 84 to a distal end. A plurality of fan vanes 88 are disposed about the hub 86 and extend radially from and axially along the hub 86 between the blower motor 84 and the distal end. A second cover 90 being L-shaped is disposed about the hub 86 and extends from the blower motor 84 to the distal end. The L-shaped cover has a lower edge 92 rigidly attached to said heat exchange leg 32 of said flat tube 30. An end plate 94 is disposed at the distal end of the second cover 90 and perpendicular to the hub 86.

The liquid pump 22 and the adapter 48 and the blower assembly 70 are all disposed between the planes of the outside walls 42 of the legs 32, 36 of the flat tube 30 and are rigidly connected together to define a unified integrated liquid cooling unit 20 for removing heat from an electronic device engaging the outside wall 42 of the heat exchange leg 32 opposite to the recess in the inside wall 44 of the heat exchange leg 32. Heat is transferred from the electronic device through the outside wall 42 of the heat exchange leg 32 of the flat tube 30 to the turbulent flow of the liquid coolant. The heat is then rejected from the liquid coolant flowing through the return leg 36 of the flat tube 30 to the cooling fins 66, 68 and to the air moved over the cooling fins 66, 68 by the blower assembly 70.

Accordingly, the invention provides a method of fabricating an integrated liquid cooling unit 20 of the type including a flat tube 30 having an entrance 34 and an exit 38 and having a cross-section presenting outside and inside flat walls 42, 44 in each leg interconnected by rounded sides 46. The method includes the steps of forming a rectangular recess 62 in the outside wall 42 of the flat tube 30 to define a rib 60 extending across the interior surface 40 of the flat tube 30 and to define a rectangular recess 62 in the inside wall 44 of the flat tube 30 and an un-recessed section 64 of the flat tube 30.

The method also includes the step of bending the flat tube 30 into a U-shape defining a heat exchange leg 32 including the rectangular recess 62 and defining a return leg 36. The method includes the steps of inserting a plurality of long cooling fins 66 between the heat exchange and return legs 32, 36 of the flat tube 30 along the recessed section of the heat exchange leg 32 and inserting a plurality of short cooling fins 68 between the heat exchange and return legs 32, 36 of the flat tube 30 along the un-recessed section 64 of the heat exchange leg 32.

The method also includes the step of connecting an adapter 48 having an input manifold 50 and an output manifold 52 to the flat tube 30 to a liquid pump 22 having an inlet 26 and an outlet 28. The method also includes the step of establishing fluid communication between the outlet 28 of the liquid pump 22 and the entrance 34 of the flat tube 30 through the input manifold 50 of the adapter 48 and establishing fluid communication between the inlet 26 of the liquid pump 22 and the exit 38 of the flat tube 30 through the output manifold 52 of the adapter 48.

The method also includes the step of positioning a blower assembly 70 including at least one fan 72 for propelling air across the cooling fins 66, 68 against one side 46 of the flat tube 30.

The method of fabricating the integrated liquid cooling unit 20 is completed by brazing the adapter 48 to the flat tube 30 and the liquid pump 22, brazing the blower assembly 70 to the one side 46 of the flat tube 30, and brazing the cooling fins 66, 68 to the inner walls 42, 44 of the legs 32, 36 of the flat tube 30 to form one integral unit. The components of the integrated liquid cooling unit 20 are preferably brazed together but any suitable means of rigidly connecting the components of the integrated liquid cooling unit 20 may be employed.

While the invention has been described with reference to an exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An integrated liquid cooling unit for cooling an electronic device comprising:
    a liquid pump having an inlet and an outlet for circulating a coolant,
    a tube extending through a heat exchange leg defining an entrance and a return leg defining an exit with said legs being spaced,
    said tube having a flat cross-section having sides defining a tube width, said flat cross-section presenting an interior surface, an outside wall and an inside wall in each leg interconnected by said sides being rounded, said tube extending in a U-shape between said entrance and said exit, and including at least one flow interrupter disposed on said heat exchange leg of said tube and defining at least one rib extending across said interior surface and defining a rectangular recess extending across said inside wall of said heat exchange leg between said rounded sides and defining an un-recessed section of said heat exchange leg of said tube, and
    an adapter being an integral component rigidly connecting said liquid pump to said tube to prevent relative movement between said liquid pump and said tube and defining an input manifold establishing fluid communication between said outlet of said liquid pump and said heat exchange leg of said tube and an output manifold establishing fluid communication between said inlet of said liquid pump and said return leg of said tube.

2. An assembly as set forth in claim 1 wherein said liquid pump includes a housing having a housing width no greater than said tube width defined by the distance between said sides of said tube.

3. An assembly as set forth in claim 2 wherein said housing of said liquid pump has a housing height being no greater than the distance between said heat exchange leg and said return leg.

4. An assembly as set forth in claim 1 wherein said inlet and outlet of said liquid pump have a diameter being greater than a thickness of said flat tube defined by the distance between said inside wall and said outside wall of each leg of said flat tube.

5. An assembly as set forth in claim 1 including a plurality of long cooling fins extending along and into said rectangular recess of said flat tube and between said heat exchange leg of said flat tube and said return leg of said flat tube,
    a plurality of short cooling fins extending along the un-recessed section of said flat tube between said heat exchange leg of said flat tube and said return leg of said flat tube.

6. An assembly as set forth in claim 1 including a plurality of cooling fins extending between said legs of said flat tube for transferring heat from said flat tube to passing air to cool the coolant in said flat tube.

7. An assembly as set forth in claim 1 wherein said adapter comprises a plate covering said entrance and said exit between said sides,
    said input manifold including a first port between said outlet of said pump and said entrance of said flat tube and said output manifold including a second port between said inlet of said pump and said exit of said flat tube.

8. An assembly as set forth in claim 1 wherein said adapter is fan-shaped and has an adapter cross-sectional area being rectangular and increasing in size from said liquid pump to said flat tube.

9. An assembly as set forth in claim 8 wherein said input manifold of said adapter diverges in a fan-shape from said outlet of said liquid pump to said entrance of said flat tube and said output manifold diverges in a fan-shape from said inlet of said liquid pump to said exit of said flat tube for evenly dispersing the liquid coolant across said entrance and exit of said flat tube.

10. An assembly as set forth in claim 1 including a blower assembly attached to and extending between said sides of said heat exchange and return legs of said flat tube on one side of said flat tube and including at least one fan for blowing air over said cooling fins between said legs.

11. An assembly as set forth in claim 10 wherein said blower assembly includes a cover extending axially along and between said legs of said flat tube and defines a plurality of holes,
    one of said fans is disposed in each of said holes for propelling air between said heat exchange and said return legs of said flat tube and through said cooling fins.

12. An assembly as set forth in claim 10 wherein said blower assembly includes a fan housing having a spiral periphery extending about a first fan axis to an exhaust and said fan is supported for rotation about said first fan axis,
    a hood extending between said exhaust and said legs to direct air from said exhaust to the space between said legs of said flat tube and through said cooling fins,
    said hood having a cross-sectional area being rectangular and increasing in size from said exhaust of said fan housing to said sides of said legs of said flat tube.

13. An assembly as set forth in claim 1 wherein said blower assembly includes a second fan axis extending parallel to said legs of said flat tube and disposed on one side of said flat tube,
    a blower motor disposed along said second fan axis and a hub operatively connected to said blower motor and extending along said second fan axis to a distal end,
    a plurality of fan vanes disposed about said hub and extending radially from and axially along said hub between said blower motor and the distal end,
    a second cover being L-shaped disposed about said hub and extending from said blower motor to the distal end and having a lower edge rigidly attached to said heat exchange leg of said flat tube, and
    an end plate disposed at the distal end of said second cover and perpendicular to said hub.

14. An integrated liquid cooling unit for cooling an electronic device comprising:
    a liquid pump having a housing and having an inlet and an outlet for circulating a coolant,
    a flat tube extending in a U-shape through a heat exchange leg defining an entrance and a return leg defining an exit with said legs being spaced and parallel to one another,
    said flat tube having a cross-section presenting outside and inside flat walls in each leg interconnected by rounded sides defining a width and extending in said U-shape between said entrance and said exit,
    a plurality of flow interrupters disposed on an interior surface of at least one of said flat walls of said flat tube for creating turbulence in the flow of the coolant to enhance heat transfer from said flat tube to the liquid coolant,
    a plurality of cooling fins extending between said legs of said flat tube for transferring heat from said flat tube to passing air to cool the coolant in said flat tube,
    a blower assembly including at least one fan for blowing air over said cooling fins between said legs of said flat tube,
    an adapter being an integral component defining an input manifold rigidly connecting said outlet of said liquid pump to the wider entrance of said heat exchange leg of said flat tube and an output manifold connecting said inlet of said liquid pump to the wider exit of said return leg of said flat tube to prevent relative movement between said pump and said flat tube, said housing of said liquid pump having a housing width being no greater than the distance between said rounded sides of said flat tube and a housing height being no greater than the distance between said outside walls of said legs, said inlet and outlet of said liquid pump having a diameter being greater than a thickness of said flat tube defined by the distance between said inside wall and said outside wall of each leg of said flat tube, said flow interrupters being disposed on said interior surface of said heat exchange leg of said flat tube and including at least one rib extending across said interior surface and defined by a reduced cross-sectional area along a section of said inside wall of said heat exchange leg to define a rectangular recess extending across said inside wall of said heat exchange leg between said rounded sides thereof and to define an un-recessed section of said heat exchange leg, a plurality of long cooling fins extending along and into said rectangular recess of said flat tube and between said heat exchange leg of said flat tube and said return leg of said flat tube, a plurality of short cooling fins extending along said unrecessed section of said heat exchange leg between said heat exchange leg of said flat tube and said return leg of said flat tube, said blower assembly attached to and extending between said rounded sides on one side of said flat tube with said pump and adapter and blower assembly disposed between the planes of said outside walls of said legs of said flat tube and rigidly connected together to define a unified liquid cooling unit for removing heat from an electronic device engaging said outside wall of said heat exchange leg opposite to said recess in said inside wall of said heat exchange leg by transferring the heat through said outside wall of said heat exchange leg to turbulent flow of the coolant through said heat exchange leg and from the coolant flowing through said return leg to said cooling fins and to the air moved over said cooling fins by said blower assembly.

15. An assembly as set forth in claim 14 wherein said adapter comprises a plate covering said entrance and said exit between said rounded sides of said flat tube, said input manifold including a first port between said outlet of said pump and said entrance of said flat tube and said output manifold including a second port between said inlet of said pump and said exit of said flat tube.

16. An assembly as set forth in claim 14 wherein said adapter is fan-shaped and has an adapter cross-sectional area being rectangular and increasing in size from said liquid pump to said flat tube, said input manifold of said adapter diverges in a fan-shape from said outlet of said liquid pump to said entrance of said flat tube and said output manifold diverges in a fan-shape from said inlet of said liquid pump to said exit of said flat tube for evenly dispersing the liquid coolant across said entrance and exit of said flat tube.

17. An assembly as set forth in claim 14 wherein said blower assembly includes a first cover extending axially along and between said legs of said flat tube and defining a plurality of holes, one of said fans is disposed in each of said holes for propelling air between said heat exchange and said return legs of said flat tube and through said cooling fins.

18. An assembly as set forth in claim 14 wherein said blower assembly includes a fan housing having a spiral periphery extending about a first fan axis to an exhaust and said fan is supported for rotation about said first fan axis, a hood extending between said exhaust and said legs to direct air from said exhaust to the space between said legs of said flat tube and through said cooling fins, said hood having a cross-sectional area being rectangular and increasing in size from said exhaust of said fan housing to said sides of said legs of said flat tube.

19. An assembly as set forth in claim 14 wherein said blower assembly includes a second fan axis extending parallel to said legs of said flat tube and disposed on one side of said flat tube, a blower motor disposed along said second fan axis and a hub operatively connected to said blower motor and extending along said second fan axis to a distal end, a plurality of fan vanes disposed about said hub and extending radially from and axially along said hub between said blower motor and the distal end, a second cover being L-shaped disposed about said hub and extending from said blower motor to the distal end and having a lower edge rigidly attached to said heat exchange leg of said flat tube, and an end plate disposed at the distal end of said second cover and perpendicular to said hub.

20. An integrated liquid cooling unit for cooling an electronic device comprising;

a liquid pump having an inlet and an outlet for circulating a coolant, a tube extending through a heat exchange leg defining an entrance and a return leg defining an exit with said legs being spaced, said tube having a cross-section having sides defining a tube width, an adapter being an integral component rigidly connecting said liquid pump to said tube to prevent relative movement between said liquid pump and said tube and defining an input manifold establishing fluid communication between said outlet of said liquid pump and said heat exchange leg of said tube and an output manifold establishing fluid communication between said inlet of said liquid pump and said return leg of said tube, a blower assembly attached to and extending between said sides of said heat exchange leg and said return leg of said tube on one side of said tube and including at least one fan for blowing air over a plurality of cooling fins between said legs and a fan housing having a spiral periphery extending about a first fan axis to an exhaust and said fan is supported for rotation about said first fan axis, and a hood extending between said exhaust and said legs to direct air from said exhaust to the space between said legs of said flat tube and through said cooling fins, said hood having a cross-sectional area being rectangular and increasing in size from said exhaust of said fan housing to said sides of said legs of said flat tube.

21. An assembly as set forth in claim 20 wherein said liquid pump includes a housing having a housing width no greater than said tube width defined by the distance between said sides of said tube.

22. An assembly as set forth in claim 21 wherein said housing of said liquid pump has a housing height being no greater than the distance between said heat exchange leg and said return leg.

23. An assembly as set forth in claim 20 wherein said tube has a flat cross-section presenting an interior surface and an outside wall and an inside wall in each leg interconnected by said sides being rounded, said flat tube extending in a U-shape between said entrance and said exit.

24. An assembly as set forth in claim 20 wherein said inlet and outlet of said liquid pump have a diameter being greater than a thickness of said flat tube defined by the distance between said inside wall and said outside wall of each leg of said flat tube.

25. An assembly as set forth in claim 20 wherein said flat tube includes at least one flow interrupter being disposed on said heat exchange leg of said flat tube and defining at least one rib extending across said interior surface and defining a rectangular recess extending across said inside wall of said heat exchange leg between said rounded sides and defining an un-recessed section of said heat exchange leg of flat tube.

26. An assembly as set forth in claim 20 including a plurality of long cooling fins extending along and into said rectangular recess of said flat tube and between said heat exchange leg of said flat tube and said return leg of said flat tube, a plurality of short cooling fins extending along the un-recessed section of said flat tube between said heat exchange leg of said flat tube and said return leg of said flat tube.

27. An assembly as set forth in claim 20 wherein the plurality of cooling fins extends between said legs of said flat tube for transferring heat from said flat tube to passing air to cool the coolant in said flat tube.

28. An assembly as set forth in claim 20 wherein said adapter comprises a plate covering said entrance and said exit between said sides, said input manifold including a first port between said outlet of said pump and said entrance of said flat tube and said output manifold including a second port between said inlet of said pump and said exit of said flat tube.

* * * * *